United States Patent
Yasunori

(10) Patent No.: US 10,677,851 B2
(45) Date of Patent: Jun. 9, 2020

(54) VOLTAGE MEASUREMENT DEVICE, VOLTAGE MEASUREMENT SYSTEM

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Hiromichi Yasunori, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 120 days.

(21) Appl. No.: 15/773,401

(22) PCT Filed: Nov. 25, 2016

(86) PCT No.: PCT/JP2016/085014
§ 371 (c)(1),
(2) Date: May 3, 2018

(87) PCT Pub. No.: WO2017/094620
PCT Pub. Date: Jun. 8, 2017

(65) Prior Publication Data
US 2018/0328993 A1  Nov. 15, 2018

(30) Foreign Application Priority Data
Nov. 30, 2015  (JP) ................................. 2015-233025

(51) Int. Cl.
*H02J 7/00* (2006.01)
*H02J 7/14* (2006.01)
(Continued)

(52) U.S. Cl.
CPC ........ *G01R 31/3835* (2019.01); *B60R 16/033* (2013.01); *B60R 16/04* (2013.01);
(Continued)

(58) Field of Classification Search
USPC ....................................................... 320/112
See application file for complete search history.

(56) References Cited

U.S. PATENT DOCUMENTS

| 2011/0031939 A1* | 2/2011 | Funaba ................. B60K 6/445 320/166 |
| 2013/0119923 A1* | 5/2013 | Wright .................. H02J 7/0073 320/107 |

(Continued)

FOREIGN PATENT DOCUMENTS

| JP | 2003-291754 A | 10/2003 |
| JP | 2013-051823 A | 3/2013 |
| JP | 2015-020619 A | 2/2015 |

OTHER PUBLICATIONS

Search Report for PCT/JP2016/085014, dated Feb. 7, 2017.

*Primary Examiner* — Alexis B Pacheco
(74) *Attorney, Agent, or Firm* — Honigman LLP

(57) ABSTRACT

A voltage measurement device includes a relay, a first voltage measurement unit, a second voltage measurement unit, a power supply circuit, and a control circuit. The power supply circuit is indirectly connected to a direct current bus. The first voltage measurement unit measures a first voltage applied to the power supply circuit. A first end of the relay is connected to the direct current bus and a second end of the relay is connected to the power storage device. The control circuit receives operating power from the power supply circuit, controls opening and closing of the relay, and closes a path between the first end and the second end when the first voltage is lower than or equal to a first threshold value. The second voltage measurement unit measures a second voltage (Continued)

applied to the second end at least when the relay is in an open state.

9 Claims, 6 Drawing Sheets

(51) Int. Cl.
    *G01R 31/3835*     (2019.01)
    *H01M 10/48*     (2006.01)
    *B60R 16/04*     (2006.01)
    *B60R 16/033*     (2006.01)

(52) U.S. Cl.
    CPC ........... H01M 10/48 (2013.01); H02J 7/0047 (2013.01); H02J 7/14 (2013.01)

(56) References Cited

U.S. PATENT DOCUMENTS

| | | | |
|---|---|---|---|
| 2013/0234504 A1* | 9/2013 | Morita | H01M 10/425 307/9.1 |
| 2013/0320986 A1* | 12/2013 | Shiraishi | G01R 31/327 324/415 |
| 2015/0183325 A1* | 7/2015 | Mitsutani | B60L 58/20 307/10.1 |
| 2015/0222206 A1* | 8/2015 | Suzuki | B60L 3/0046 318/139 |
| 2017/0168115 A1* | 6/2017 | Lung | G01R 31/3278 |

\* cited by examiner

VOLTAGE MEASUREMENT DEVICE, VOLTAGE MEASUREMENT SYSTEM

CROSS-REFERENCE TO RELATED APPLICATIONS

This application is the US national stage of PCT/JP2016/085014 filed Nov. 25, 2016 which claims priority of Japanese Patent Application No. JP 2015-233025 filed Nov. 30, 2015.

TECHNICAL FIELD

This present invention relates to a voltage measurement device, and more particularly, to a technology for measuring an open-circuit voltage of an in-vehicle power storage device.

BACKGROUND ART

In order to diagnose a power storage device mounted in a vehicle (including a so-called battery or electric double-layer capacitor), it is known to use measurement of an internal resistance. For example, JP 2014-230343A discloses a technology in which a main battery and a sub battery are provided together, and the internal resistance of the sub-battery is measured using the current value and the voltage value at the time at which a smoothing capacitor is charged by the sub-battery.

It is also known that, when diagnosing the power storage device, higher accuracy can be gained by using not only the internal resistance, but also the voltage of the power storage device at the time of opening (open-circuit voltage). However, if the vehicle in which the power storage device is mounted is traveling, the power storage device is charged by an alternator provided in the vehicle, and thus a charging path from the alternator to the power storage device needs to be cut off when the open-circuit voltage is measured.

On the other hand, when supplying power to an electric load mounted in the vehicle, there is a case where a discharge current from not only the alternator but also the power storage device is required while the vehicle is traveling. Also, because this discharging path has a portion in common with the above-mentioned charging path, there is a possibility that the supply of power to the electric load is not sufficiently performed if the charging path is simply cut off.

In view of this, an object of the present invention is to provide a technology that avoids a power shortage while a vehicle is traveling caused by measuring an open-circuit voltage of a power storage device mounted in the vehicle.

SUMMARY

A voltage measurement device measures an open-circuit voltage of a first power storage device that is indirectly connected to a direct current bus connected to a generator and a vehicle load mounted in a vehicle. The voltage measurement device includes: a power supply circuit that is connected to the direct current bus; a first voltage measurement unit configured to measure a first voltage applied to the power supply circuit; a relay that is interposed between the direct current bus and the first power storage device, and has a first end connected to the direct current bus and a second end connected to the first power storage device; a control circuit configured to receive operating power from the power supply circuit, to control opening and closing of the relay, and to close a path between the first end and the second end when the first voltage is lower than or equal to a first threshold value; and a second voltage measurement unit configured to measure a second voltage applied to the second end at least when the relay is in an open state.

A power shortage while the vehicle is traveling caused by measuring the open-circuit voltage of the power storage device mounted in the vehicle is avoided.

DETAILED DESCRIPTION OF PREFERRED EMBODIMENTS

Figure 1:
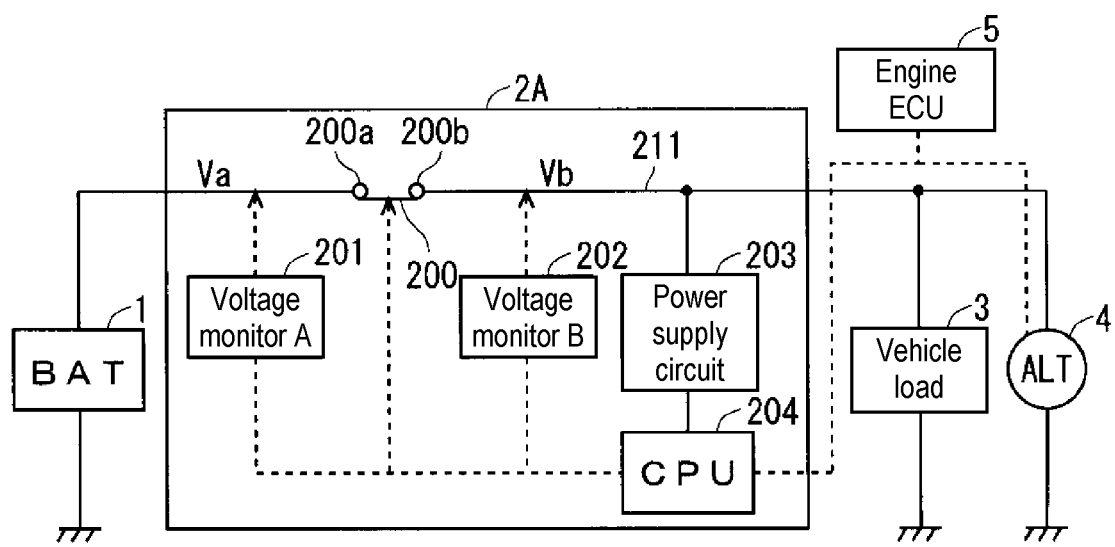
FIG. 1 is a block diagram showing an example of a configuration of a voltage measurement device and surroundings thereof according to a first embodiment.

The following will describe a voltage measurement device 2A according to a first embodiment. FIG. 1 is a block diagram showing an example of a configuration of the voltage measurement device 2A and surroundings thereof. The voltage measurement device 2A has a function for measuring an open-circuit voltage of a power storage device 1 (in the figures, denoted as "BAT") mounted in a vehicle. The power storage device 1 is connected to an alternator 4 (in the figures, denoted as "ALT") via a direct current bus 211. The alternator 4 functions as an in-vehicle generator that generates electricity with rotation of an engine (not shown), and charges the power storage device 1 through the direct current bus 211 as a charging path. Normally, a positive potential is applied to the direct current bus 211. Note that, a voltage generated by the alternator 4 (generation voltage) is controlled by an ECU (Electronic Control Unit) 5 such that the voltage is set to be a predetermined voltage.

For example, the power storage device 1 may be a lead storage battery, or may be an electric double-layer capacitor. A vehicle load 3 is an electric load that is mounted in the vehicle, and can be supplied with power from either the alternator 4 or the power storage device 1 via the direct current bus 211.

The voltage measurement device 2A includes a relay 200, a power supply circuit 203, voltage measurement units 201 and 202, and a control circuit 204. The power supply circuit 203 is connected to the direct current bus 211, and converts a voltage Vb that is applied from the direct current bus 211, and then applies the converted voltage to the control circuit 204. The voltage Vb is measured by the voltage measurement unit 202 (in the figures, denoted as "Voltage monitor B").

The relay 200 is interposed between the power storage device 1 and the direct current bus 211, and has ends 200a and 200b. That is, the power storage device 1 is indirectly connected to the direct current bus 211 via the relay 200. The end 200a is connected to the power storage device 1, whereas the end 200b is connected to the direct current bus 211. In the relay 200, the path between the ends 200a and 200b is closed (short-circuited) when the voltage Vb is lower than or equal to a first threshold value, whereas the path is opened (open) when the voltage Vb is higher than or equal to a second threshold value. Note that, the first threshold value is lower than the second threshold value. The end 200b and the end 200a can be recognized as the first end and the second end respectively.

The control circuit 204 (in the figures, denoted as "CPU") operates by receiving operating power from the power supply circuit 203. The control circuit 204 can be realized using a well-known microcomputer. A specific first operation of the control circuit 204 is to cause the engine ECU 5 to control the generation voltage of the alternator 4. A specific second operation is to cause the voltage measurement unit 202 to measure the voltage Vb applied to the power supply circuit 203, and control opening and closing of the relay 200 in accordance with the measured voltage value. A specific third operation is to cause the voltage measurement unit 201 (in the figures, denoted as "Voltage monitor A") to measure a voltage Va applied to the end 200a at least when the relay 200 is in an open state. The voltage measurement units 202 and 201 can be recognized as a first voltage measurement unit and a second voltage measurement unit respectively.

Figure 2:
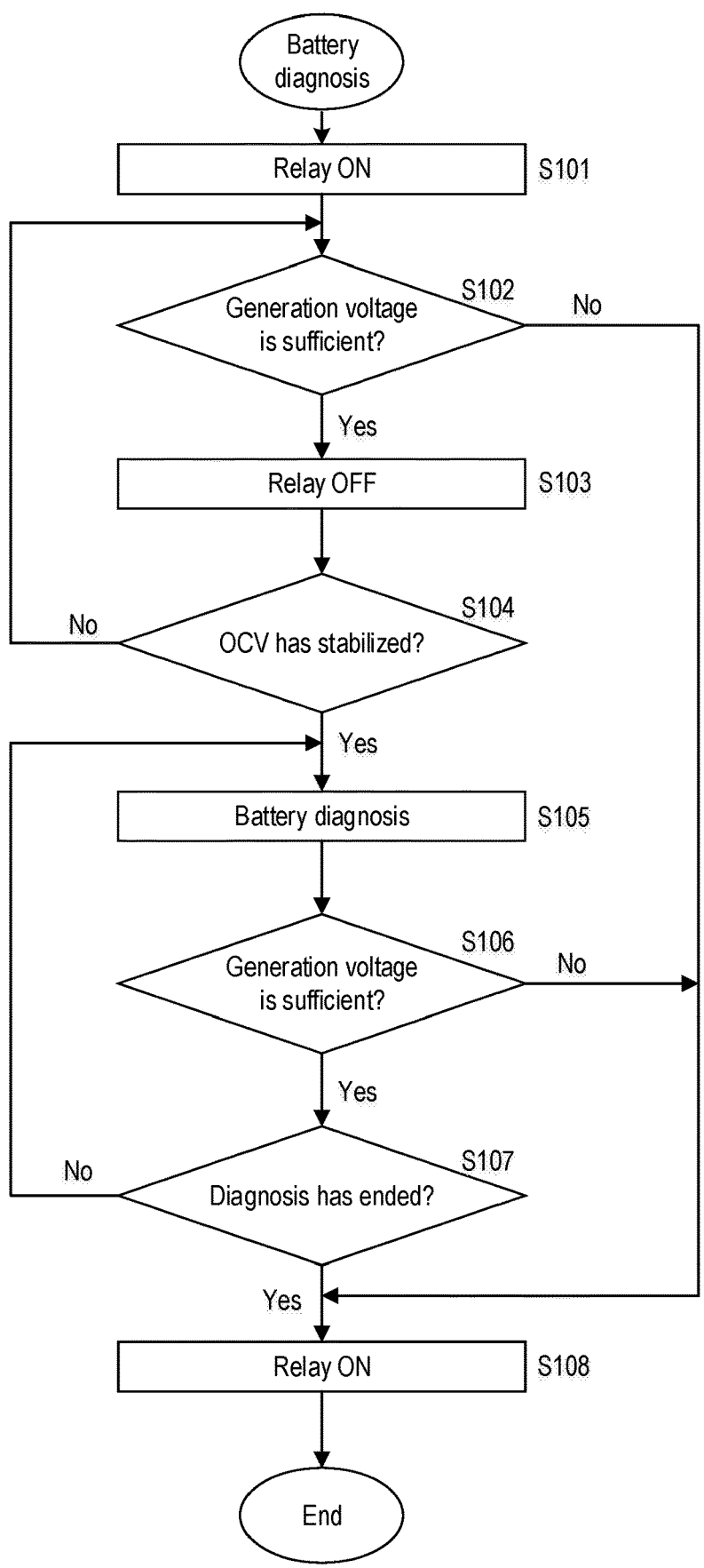
FIG. 2 is a flowchart showing an example of operations of the voltage measurement device according to the first embodiment.

FIG. 2 is a flowchart showing an example of operations of the voltage measurement device 2A according to the first embodiment, and shows control performed by the control circuit 204. Steps S101 to S104, S106, and S108 correspond to the above-mentioned second operation, and steps S105 and S107 correspond to the above-mentioned third operation. In FIG. 2, "Battery diagnosis" means diagnosis of the power storage device 1. This diagnosis includes obtaining the open-circuit voltage of the power storage device 1.

In step S101, the relay 200 is closed (turned ON) once by the control circuit 204. Normally, the power storage device 1 is charged by the alternator 4 via the direct current bus 211 and discharges electricity to the vehicle load 3 via the direct current bus 211, and thus the relay 200 is closed while the vehicle is traveling. Step S101 may be omitted.

After step S101 is executed, in step S102, it is determined whether or not the voltage Vb is higher than or equal to the second threshold value. The second threshold value is a voltage value that is sufficient for supplying power to the vehicle load 3. Such a voltage value can be set in advance according to characteristics of the vehicle load 3. The voltage Vb is a voltage that the alternator 4 generates, and it is determined whether or not the voltage Vb is sufficient for supplying power to the vehicle load 3. Thus, in FIG. 2, it is denoted as "Generation voltage is sufficient?" in step S102. If the determination is affirmative (if the voltage Vb is higher than or equal to the second threshold value), the relay 200 is opened (turned OFF) in step S103. Accordingly, the power storage device 1 is cut off from the vehicle load 3 and the alternator 4, thus not being charged and discharging. In this way, the open-circuit voltage (in the figures, denoted as "OCV") of the power storage device 1 can be measured.

If the determination in step S102 is negative (if the voltage Vb is lower than the second threshold value), the relay 200 is closed in step S108. This is because, when the relay 200 is opened and measurement of the open-circuit voltage starts, it is anticipated that the supply of power to the vehicle load 3 is insufficient because power supply from the power storage device 1 to the vehicle load 3 is lost. To avoid such a power supply shortage, the determination process of step S102 is provided.

Specifically, the open-circuit voltage is the voltage Va that the voltage measurement unit 201 measures when the relay 200 is opened. Of course, the voltage measurement unit 201 may measure the voltage Va when the relay 200 is closed, but measures the voltage Va at least when the relay 200 is opened.

Note that, especially in the case where a chemical battery such as a lead storage battery is employed as the power storage device 1, time is required for the open-circuit voltage of the power storage device 1 to stabilize. Therefore, the battery diagnosis is executed in step S105 after it is determined that the open-circuit voltage has stabilized in step S104. This includes measurement of the voltage Va.

In step S104, it may be determined that the open-circuit voltage has stabilized based on the fact that variation of the voltage Va is within a predetermined range. Also, it may be determined that the open-circuit voltage has stabilized based on the fact that a predetermined time necessary for the open-circuit voltage to stabilize has elapsed since the relay 200 was opened in step S103.

If the determination in step S104 is negative (the determination that the open-circuit voltage has not stabilized), step S102 is executed again, and it is determined whether or not the voltage Vb of the open-circuit voltage is higher than or equal to the second threshold value. In this way, even while waiting for the open-circuit voltage to stabilize, a shortage of power supply to the vehicle load 3 is avoided by executing step S102 again.

Similarly, after the battery diagnosis has started in step S105, it is determined whether or not the voltage Vb is higher than the first threshold value in step S106. The first threshold value is a voltage value that is required for supplying power to the vehicle load 3. This voltage value can be set in advance according to characteristics of the vehicle load 3. If the voltage Vb becomes lower than or equal to the first threshold value during the battery diagnosis, the battery diagnosis is stopped, and the relay 200 is closed in order to enable power supply from the power storage device 1 to the vehicle load 3. That is, if the diagnosis result in step S106 is negative, step S108 is executed.

If the voltage Vb maintains a value higher than the first threshold value during the battery diagnosis, the determination in step S106 is affirmative, and it is determined whether or not the battery diagnosis has ended in step S107. This is a process provided in view of the fact that the diagnosis of the power storage device 1 requires a comprehensive determination not only using the voltage Va of the open-circuit voltage, but also, for example, using the internal resistance of the power storage device 1 that has already been obtained, and thus the diagnosis does not necessarily end after only obtaining the voltage Va. If the determination result in step S107 is negative (if the battery diagnosis has not ended), steps S105 and S106 are repeatedly executed. In this way, even during the battery diagnosis, a shortage of power supply to the vehicle load 3 is avoided by executing step S106 again.

If the determination result in step S107 is affirmative (if the battery diagnosis has ended), the relay 200 is closed (turned ON) in step S108 in order to make it possible to charge the power storage device 1 and discharge electricity therefrom.

In this way, because priority is given to the supply of power to the vehicle load 3 of the vehicle during traveling using the first threshold value, a power shortage while the vehicle is traveling caused by measuring the open-circuit voltage of the power storage device 1 is avoided.

Figure 3:
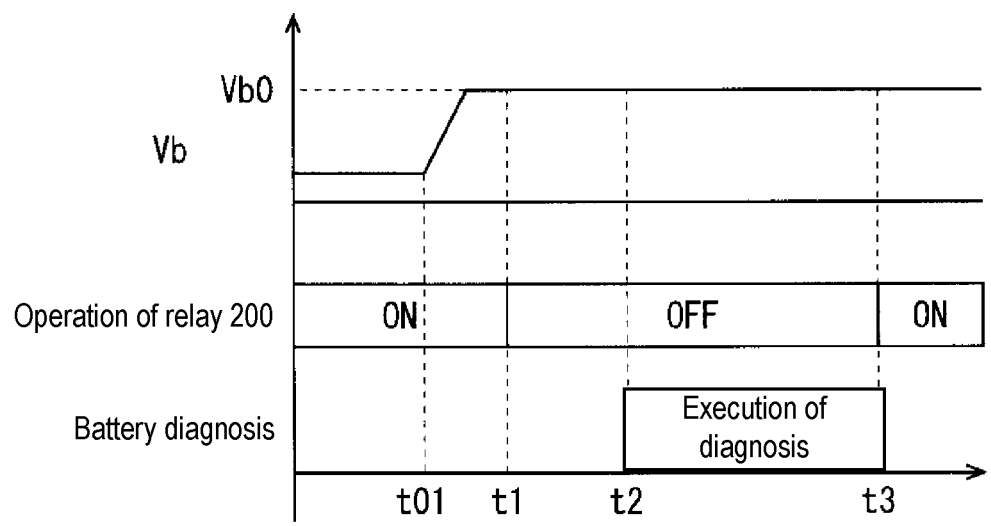
FIG. 3 is a graph showing states of operation of a relay and battery diagnosis according to the first embodiment.
Figure 4:
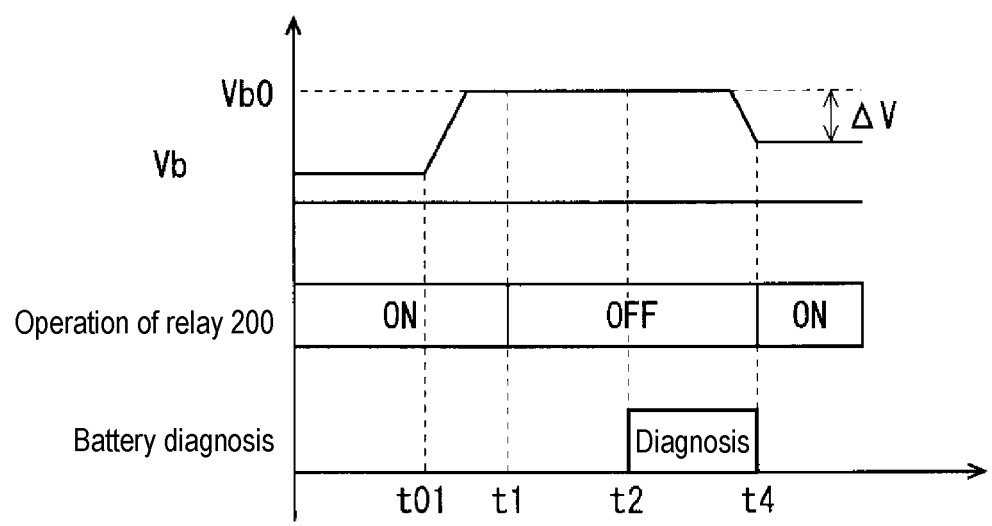
FIG. 4 is a graph showing states of operation of the relay and battery diagnosis according to the first embodiment.

The following will describe the above operations in view of temporal transition. FIGS. 3 and 4 are graphs in which the horizontal axis represents time, and show states of the voltage Vb, operation of the relay 200, and the battery diagnosis. Note that, FIG. 3 shows a case where the diagnosis is not interrupted, whereas FIG. 4 shows a case where the diagnosis is interrupted.

In both of FIGS. 3 and 4, an event corresponding to the above-mentioned first operation occurs at time 01. Specifically, under control of the control circuit 204, the engine ECU 5 instructs the alternator 4 to generate power at a predetermined voltage value Vb0 (>0). Accordingly, the voltage Vb rises and reaches the voltage value Vb0. Steps S102 and S108 are executed until the voltage Vb reaches the second threshold value. The second threshold value is set at the voltage value Vb0 or lower, for example, set at the voltage value Vb0.

In both cases of FIGS. 3 and 4, the voltage Vb reaches the voltage value Vb0 by time t1, and step S103 is executed at the time t1. Accordingly, the relay 200 turns off (opens). After that, steps S104, S102, and S103 are repeatedly executed, and then step S105 is executed at time t2. In this way, both of FIGS. 3 and 4 illustrate a case where the voltage Vb has not become lower than the second threshold value by the time step S105 is executed after step S103 was executed.

FIG. 3 shows a case where the voltage Vb maintains the voltage value Vb0, and does not become lower than or equal to the first threshold value, which is lower than the second threshold value, until an affirmative determination is obtained in step S107. In this case, the determination result in step S106 is not negative. An affirmative determination is obtained at time t3 in step S107, and then by step S108 being executed, the relay 200 turns on (closes).

FIG. 4 shows a case where a value (Vb0−ΔV) (note that, ΔV>0) is employed as the first threshold value. While steps S105 to S107 are being repeatedly executed, the voltage Vb decreases, and reaches the first threshold value at time t4. Accordingly, the determination result in step S106 is negative, and the relay 200 turns on (closes) in step S108. Also, step S108 has been executed before the affirmative determination is obtained in step S107, and thus the battery diagnosis is interrupted.

Note that, it is desirable that the relay 200 is a normally-closed relay. Even if the relay 200 is a normally-closed relay, the above-mentioned operation is not prevented. In a state where the relay 200 is in the open state in the middle of the battery diagnosis, if the power generation capability of the alternator 4 decreases or malfunctions, or the performance of the power supply circuit 203 decreases or malfunctions, then the normally-closed relay 200 is closed, and thus the power storage device 1 can be used to supply power to the vehicle load 3. This is desirable from the viewpoint that the supply of power to the vehicle load 3 in the vehicle in traveling is not prevented.

Figure 5:
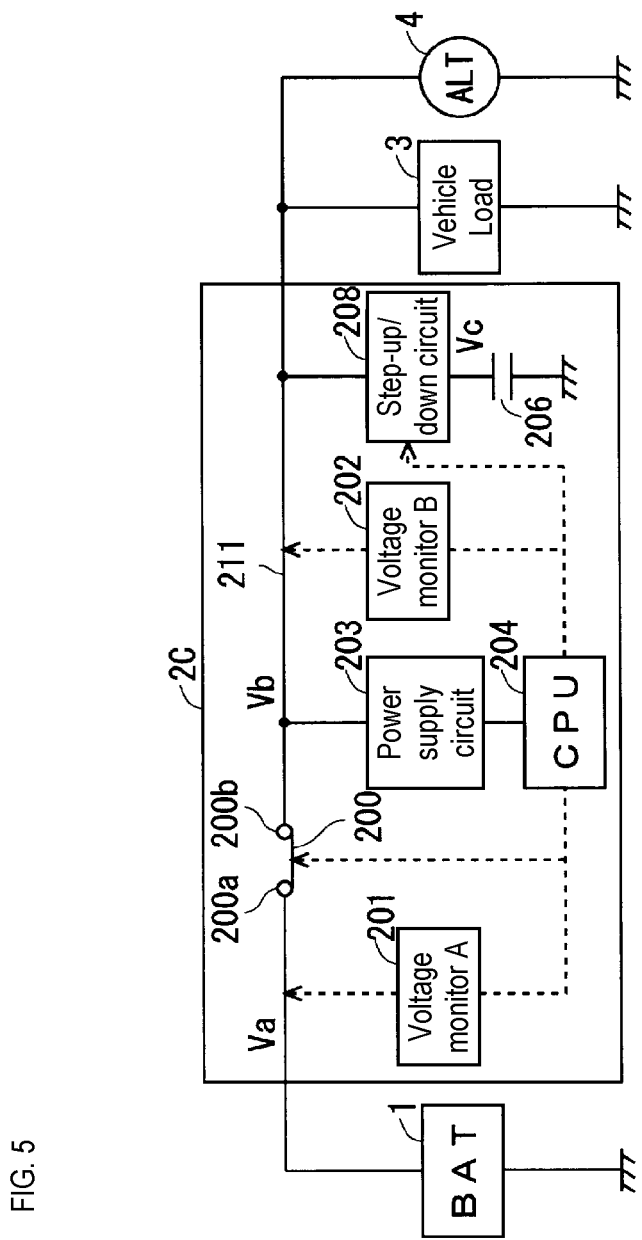
FIG. 5 is a block diagram showing an example of a configuration of a voltage measurement device and surroundings thereof according to a second embodiment.

The following will describe a voltage measurement device 2C according to a second embodiment. FIG. 5 is a block diagram showing an example of a configuration of the voltage measurement device 2C and surroundings thereof. Note that, in the description of this embodiment, constituent elements that are the same as those described in the first embodiment are denoted by the same reference numerals, and description thereof is omitted.

The voltage measurement device 2C has a configuration in which a power storage device 206 and a step-up/down circuit 208 are added to the voltage measurement device 2A. The power storage device 206 is an electric double-layer capacitor for example, and the capacitance thereof is, for example, a range of about several F to around a dozen F. The power storage devices 1 and 206 can be recognized as a first power storage device and a second power storage device respectively. A bi-directional step-up/down circuit is employed for the step-up/down circuit 208 for example. The step-up/down circuit 208 is connected to the direct current bus 211, and the power storage device 206 is connected to the direct current bus 211 via the step-up/down circuit 208. Conversion of the voltage between the power storage device 206 and the direct current bus 211 is performed by the step-up/down circuit 208.

Under control of the control circuit 204, the step-up/down circuit 208 enables both of charging from the direct current bus 211 to the power storage device 206, and discharging from the power storage device 206 to the direct current bus 211. Such discharging can be employed for both of power supply from the power storage device 206 to the vehicle load 3, and power supply from the power storage device 206 to the power supply circuit 203.

The voltage measurement unit 202 measures the voltage Vb similarly to the above-described first embodiment. Accordingly, the voltage measurement device 2C, similarly to the voltage measurement device 2A, can execute the flowchart shown in FIG. 2, and thus a power shortage while the vehicle is traveling caused by measuring the open-circuit voltage of the power storage device 1 is avoided.

While the vehicle is stopped, the alternator 4 does not generate electricity, but it is necessary to supply power to the vehicle load 3. The current required for such power supply is called dark current, which is required for, for example, wireless communication such as a function of opening a door wirelessly. Normally, dark current is obtained by discharge from the power storage device 1. Thus, if the relay 200 is opened and the open-circuit voltage is measured, this dark current is cut off. Moreover, power is not supplied from the alternator 4 to the power supply circuit 203. Accordingly, even if an attempt is made to measure the open-circuit voltage with the relay 200 opened while the vehicle has stopped, the control circuit 204 does not operate.

In view of this, in the second embodiment, a technology for measuring the open-circuit voltage of the power storage device 1 without cutting off the dark current even in the case where the vehicle is stopped is illustrated. Because such a technology is described, in FIG. 5, the engine ECU 5 (shown in FIG. 1) that instructs the alternator 4 to generate power at a generation voltage is omitted.

Figure 6:
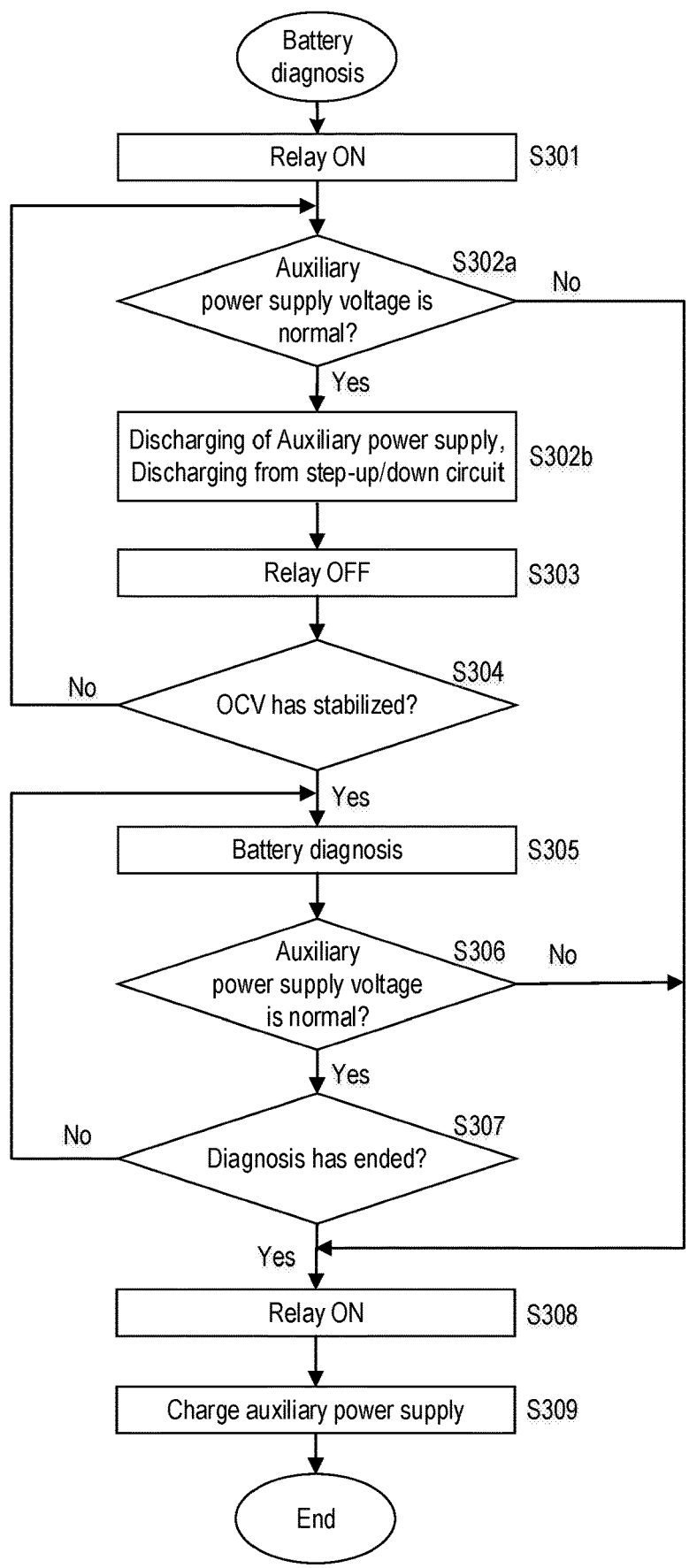
FIG. 6 is a flowchart showing an example of operations of the voltage measurement device according to the second embodiment.

FIG. 6 is a flowchart showing an example of operations of the voltage measurement device 2C according to the second embodiment, and shows control performed by the control circuit 204. Steps S301, S303, S304, S305, S307, and S308 are respectively the same processes as steps S101, S103, S104, S105, S107, and S108 in FIG. 2.

In the second embodiment, instead of step S102 in the first embodiment, steps S302a and S302b are executed. In step S302a, as a fourth operation, the control circuit 204 determines whether or not a voltage Vc of the power storage device 206 serving as an auxiliary power supply is normal. Similarly to step S102, if the determination result is negative, step S308 is executed, and the control circuit 204 turns on (closes) the relay 200. Then, in step S309, the power storage device 1 charges the power storage device 206 via the relay 200 and the direct current bus 211. On the other hand, if the determination result is affirmative, step S302b is executed.

Specifically, in step S302a, the control circuit 204 detects the voltage Vc via the step-up/down circuit 208. It is determined that the voltage of the auxiliary power supply is normal if the voltage Vc is higher than or equal to a third threshold value, whereas it is determined that the voltage of the auxiliary power supply is not normal if the voltage Vc is lower than the third threshold value. The third threshold value is a threshold value with respect to the voltage Vc, according to which the step-up/down circuit 208 can convert the voltage Vc and Vb to a voltage that can sufficiently supply the dark current to the vehicle load 3. A technology for detecting the voltage Vc is a well-known technology, and thus a detailed description thereof will not be given here.

In step S302b, because it has been determined that the dark current is obtained even if the relay 200 is turned off in step S302a, the power storage device 206 discharges via the step-up/down circuit 208. Because the dark current is obtained by executing step S302b, step S303 is executed, thus the control circuit 204 turns off (opens) the relay 200.

In the second embodiment, after the battery diagnosis has been executed in step S305, step S306 is executed instead of step S106 in the first embodiment. In step S306, the same determination as in step S302a is performed, and if the determination result is negative, then steps S308 and S309 are executed. If the determination result is affirmative, step S307 is executed, and then step S305 or steps S308 and S309 are executed similarly to step S107.

Depending on whether or not the voltage Vc of the power storage device 206 is higher than or equal to the third threshold value, the control circuit 204 opens or closes the path between the end 200a and the end 200b. In the above-described manner, in the flowchart in FIG. 6, by employing, as the third threshold value, a value according to which it is determined that the auxiliary power supply voltage is normal, the open-circuit voltage can be measured even while the vehicle has stopped, and also the dark current can be obtained.

Figure 7:
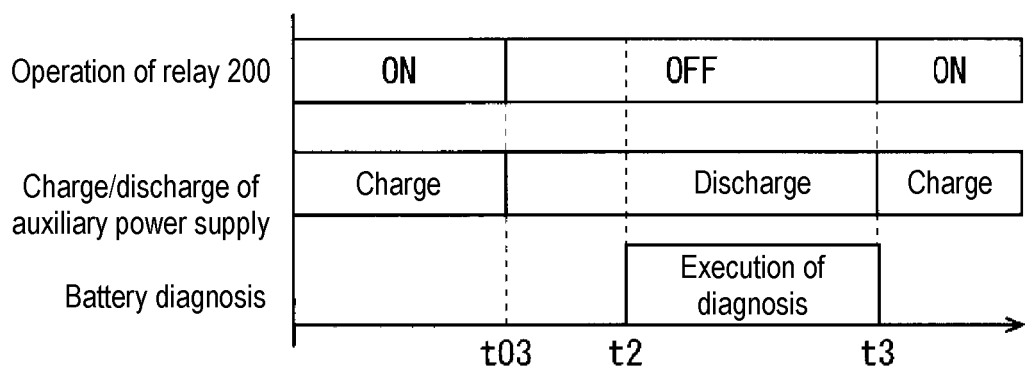
FIG. 7 is a graph showing states of operation of a relay and battery diagnosis according to the second embodiment.

The following will describe the above-mentioned operation in view of temporal transition. FIG. 7 is a graph in which the horizontal axis represents time, and shows states of operation of the relay 200, charging and discharging of the power storage device 206 (in the figures, denoted as "Auxiliary power supply"), and the battery diagnosis.

At time t03, an affirmative determination is made in step S302a, steps S302b and S303 are executed, and then the relay 200 turns off (opens). After that, steps S304, S302a, S302b, and S303 are repeatedly executed, and then step S305 is executed at time t2. In this manner, this illustrates a case where after step S303 is executed, a negative determination is not made in step S302a before step S305 is executed.

Also, this illustrates a case where a negative determination has not been made in step S306 before an affirmative determination is obtained in step S307. At time t3, an affirmative determination is made in step S307, and due to step S308 being executed, the relay 200 turns on (closes).

Of course, if a negative determination is made in step S306, the battery diagnosis is interrupted, and then the relay 200 turns on (closes) due to step S308 being executed, and thus the power storage device 206 is charged in step S309.

In this manner, by employing the power storage device 206 as the auxiliary power supply, power is supplied to the power supply circuit 203 even while the vehicle is parked, operation failure of the control circuit 204 is avoided, and the open-circuit voltage of the power storage device 1 is measured. Moreover, by employing the determinations of steps S302a and S306, the dark current can be obtained.

In this embodiment as well, it is desirable that the relay 200 is a normally-closed relay. This is because, even if the relay 200 is a normally-closed relay, the above-mentioned operation is not prevented. Also, this is because, even if operation failure of the control circuit 204 occurs due to power supply from the power storage device 206 being insufficient, power is supplied from the power storage device 1 to the power supply circuit 203 via the relay 200 that has been closed, thus restoring the operation of the control circuit 204.

In the first embodiment, whether or not the current flowing to the vehicle load 3 has increased may be employed as the basis of the determination in step S106. This is because, such an increase of the current causes power that is supplied to the vehicle load 3 to be insufficient in the state where the relay 200 is opened. In this case, if the current has increased, step S108 is executed, whereas if the current has not increased, step S107 is executed.

In the second embodiment, the capability of the step-up/down circuit 208 to convert the voltage Vc to the voltage Vb is set in advance. Letting this conversion magnification rate be set in K (>0), the first threshold value is set to K times the third threshold value, and thus step S102 can be used instead of both steps S302a and S306. In other words, in the second embodiment as well, by setting the first threshold value as described above, by closing the path between the ends 200a and 200b when the voltage Vb is lower than or equal to the first threshold value, the control circuit 204 can close the path between the ends 200a and 200b when the voltage Vc is lower than or equal to the third threshold value.

In the second embodiment, the power storage device 206 may be incorporated in the voltage measurement device 2C as illustrated in FIG. 5, or may be provided outside the voltage measurement device 2C. Also, the power storage device 206 and the voltage measurement device 2C can be collectively considered as a voltage measurement system for measuring the open-circuit voltage of the power storage device 1.

The voltage measurement devices 2A and 2C may be incorporated in a relay box mounted in a vehicle, or may be provided between the power storage device 1 and the relay box.

Note that the configurations described in the above embodiments and variations can be appropriately combined as long as there are no contradictions.

Although the invention has been described in detail above, the foregoing description is, in all respects, illustrative, and the invention is not limited to that description. It should be understood that innumerable variations that are not illustrated herein can be conceived without departing from the scope of the invention.

The invention claimed is:

1. A voltage measurement device that measures an open-circuit voltage of a first power storage device that is indirectly connected to a direct current bus connected to a generator and a vehicle load mounted in a vehicle, the voltage measurement device comprising:
a power supply circuit that is connected to the direct current bus;
a first voltage measurement unit configured to measure a first voltage applied to the power supply circuit;
a relay that is interposed between the direct current bus and the first power storage device, and has a first end connected to the direct current bus and a second end connected to the first power storage device;

an alternator configured to selectively provide power to the vehicle load and be charged by the first power storage device, the alternator connected to the direct current bus bar;

a control circuit configured to receive operating power from the power supply circuit, to control opening and closing of the relay, and to close a path between the first end and the second end when the first voltage is lower than or equal to a first threshold value; and a second voltage measurement unit configured to measure a second voltage applied to the second end at least when the relay is in an open state;

wherein the control circuit opens the path between the first end and the second end when the first voltage is higher than or equal to a second threshold value that is higher than the first threshold value, wherein the second threshold value is a voltage value that is sufficient for supplying power to the vehicle load.

2. The voltage measurement device according to claim 1, further comprising a step-up/down circuit that is connected to the direct current bus, wherein a second power storage device is also connected to the direct current bus via the step-up/down circuit.

3. The voltage measurement device according to claim 2, wherein the control circuit opens or closes the path between the first end and the second end depending on whether or not a voltage of the second power storage device is higher than or equal to a third threshold value.

4. The voltage measurement device according to claim 1 wherein the relay is a normally-closed relay.

5. A voltage measurement system comprising: the voltage measurement device according to claim 2; and the second power storage device.

6. The voltage measurement system according to claim 5, wherein the relay is a normally-closed relay.

7. The voltage measurement device according to claim 2, wherein the relay is a normally-closed relay.

8. The voltage measurement device according to claim 3, wherein the relay is a normally-closed relay.

9. A voltage measurement system comprising:

the voltage measurement device according to claim 3; and the second power storage device.

\* \* \* \* \*